US012225635B2

(12) United States Patent
Phillips et al.

(10) Patent No.: US 12,225,635 B2
(45) Date of Patent: Feb. 11, 2025

(54) METHOD AND SYSTEM FOR PROVIDING VARIABLE RAMP-UP CONTROL FOR AN ELECTRIC HEATER

(71) Applicant: Watlow Electric Manufacturing Company, St. Louis, MO (US)

(72) Inventors: Brittany Phillips, St. Louis, MO (US); Stanton H. Breitlow, Winona, MN (US); Kevin Ptasienski, O'Fallon, MO (US)

(73) Assignee: Watlow Electric Manufacturing Company, St. Louis, MO (US)

( * ) Notice: Subject to any disclaimer, the term of this patent is extended or adjusted under 35 U.S.C. 154(b) by 159 days.

(21) Appl. No.: 17/400,822

(22) Filed: Aug. 12, 2021

(65) Prior Publication Data

US 2022/0053609 A1    Feb. 17, 2022

Related U.S. Application Data

(60) Provisional application No. 63/064,523, filed on Aug. 12, 2020.

(51) Int. Cl.
*H05B 1/02* (2006.01)
*G01K 1/02* (2021.01)
(Continued)

(52) U.S. Cl.
CPC .......... *H05B 1/0233* (2013.01); *G01K 1/026* (2013.01); *G01K 3/005* (2013.01); *G01K 3/14* (2013.01);
(Continued)

(58) Field of Classification Search
CPC .......... G01K 1/026; G01K 3/005; G01K 3/14; G01R 19/16571; G05D 23/1904;
(Continued)

(56) References Cited

U.S. PATENT DOCUMENTS

| 5,968,586 A | 10/1999 | Etzel |
| 5,968,587 A | 10/1999 | Frankel |

(Continued)

FOREIGN PATENT DOCUMENTS

| TW | 202027195 A | 7/2020 |
| WO | 2019112652 A1 | 6/2019 |

OTHER PUBLICATIONS

Search Report issued in corresponding TW Application No. 110129836, dated Aug. 14, 2022, 1 page.
(Continued)

*Primary Examiner* — Sang Y Paik
(74) *Attorney, Agent, or Firm* — Burris Law, PLLC

(57) ABSTRACT

In one form, the present disclosure is directed toward a method for controlling temperature of a heater including a resistive heating element. The method includes applying power to the resistive heating element of the heater at a variable ramp rate to increase temperature of the heater to a desired temperature setpoint. The variable ramp rate is set to a desired ramp rate. The method further includes monitoring an electric current flowing through the resistive heating element of the heater, and reducing the variable ramp rate from the desired ramp rate to a permitted ramp rate in response to the electric current being greater than a lower limit of an electric current limit band. An upper limit of the electric current limit band is provided as a system current limit.

25 Claims, 11 Drawing Sheets

(51) Int. Cl.
*G01K 3/00* (2006.01)
*G01K 3/14* (2006.01)
*G01R 19/165* (2006.01)
*G05D 23/19* (2006.01)
*H01L 21/67* (2006.01)
*H05B 3/22* (2006.01)

(52) U.S. Cl.
CPC ... *G01R 19/16571* (2013.01); *G05D 23/1904* (2013.01); *H05B 3/22* (2013.01); *H01L 21/67115* (2013.01); *H01L 21/67248* (2013.01)

(58) Field of Classification Search
CPC ......... H01L 21/67115; H01L 21/67248; H05B 1/0233; H05B 3/22
USPC ............................ 219/482–490, 443.1–468.2
See application file for complete search history.

(56) References Cited

U.S. PATENT DOCUMENTS

| | | | |
|---|---|---|---|
| 6,207,937 B1* | 3/2001 | Stoddard | C30B 25/10 392/416 |
| 6,259,072 B1 | 7/2001 | Kinnard et al. | |
| 6,441,350 B1 | 8/2002 | Stoddard et al. | |
| 6,469,283 B1* | 10/2002 | Burkhart | H01L 21/67103 219/486 |
| 6,616,767 B2 | 9/2003 | Zhao et al. | |
| 6,901,317 B2 | 5/2005 | Starner | |
| 7,655,092 B2 | 2/2010 | Fairbairn et al. | |
| 9,883,549 B2 | 1/2018 | Matyushkin et al. | |
| 10,690,705 B2 | 6/2020 | Breitlow et al. | |
| 10,908,195 B2 | 2/2021 | Breitlow et al. | |
| 11,038,431 B2 | 6/2021 | Ness et al. | |
| 2003/0168442 A1 | 9/2003 | Porter et al. | |
| 2008/0017104 A1* | 1/2008 | Matyushkin | H01L 21/6831 118/58 |
| 2010/0054720 A1* | 3/2010 | Hunter | H01L 21/67248 392/416 |
| 2017/0363663 A1 | 12/2017 | Breitlow et al. | |
| 2018/0348265 A1* | 12/2018 | Hopkins-Breitlow | F24D 11/0207 |

OTHER PUBLICATIONS

International Search Report for corresponding International Application No. PCT/US2021/045732, mailed Nov. 29, 2021, 9 pages.
International Search Report for corresponding International Application No. PCT/US2021/045735, mailed Nov. 24, 2021, 10 pages.

* cited by examiner

METHOD AND SYSTEM FOR PROVIDING VARIABLE RAMP-UP CONTROL FOR AN ELECTRIC HEATER

CROSS-REFERENCE TO RELATED APPLICATIONS

This application claims priority to and the benefit of U.S. Provisional Application 63/064,523 filed on Aug. 12, 2020. The disclosure of the above application is incorporated herein by reference.

FIELD

The present disclosure relates to controlling the temperature of a heater.

BACKGROUND

The statements in this section merely provide background information related to the present disclosure and may not constitute prior art.

A thermal system generally includes a heater having resistive heating elements and a control system for controlling power to the heater to generate heat at a temperature setpoint. In an example application, a semiconductor process system includes a thermal system having a pedestal heater that includes a heating plate with a ceramic substrate and one or more resistive heating elements that define one or more heating zones. The pedestal heater can be heated to different temperature setpoints to perform various processes such as heating a semiconductor wafer, a cleaning cycle, and among other operations.

To reach the temperature setpoint, the control system typically ramps up the temperature at a standard ramp rate (e.g., 5° C./min, 10° C./min, among others). The time spent changing the temperature setpoint typically idles a semiconductor chamber having the heater, which is lost or non-productive manufacturing time. These and other issues related to adjusting temperature of a heater are addressed by the present disclosure.

SUMMARY

This section provides a general summary of the disclosure and is not a comprehensive disclosure of its full scope or all of its features.

In one form, the present disclosure is directed to a method of controlling temperature of a heater including a resistive heating element, and the method includes applying power to the resistive heating element of the heater at a variable ramp rate to increase temperature of the heater to a desired temperature setpoint, where the variable ramp rate is set to a desired ramp rate. The method further includes monitoring an electric current flowing through the resistive heating element of the heater and reducing the variable ramp rate from the desired ramp rate to a permitted ramp rate in response to the electric current being greater than a lower limit of an electric current limit band, where an upper limit of the electric current limit band is provided as a system current limit.

In one variation, reducing the variable ramp rate further includes determining a reduction amount of the desired ramp rate based on a variable reduction factor, where the variable reduction factor increases as the electric current of the resistive heating element approaches the system current limit and decreasing the variable ramp rate by the reduction amount to the permitted ramp rate.

In another variation, the variable reduction factor provides a scaled reduction of the variable ramp rate based on proximity of the electric current to the system current limit.

In yet another variation, wherein the reduction amount is determined based on the following: RedAmt=(DesiredRate*% Reduction*RedFactor), where Reduction=1.0−((ZoneCurLim−MeasuredCurrent)/CurrentBand) in which: "RedAmt" is the reduction amount, "DesiredRate is the desired ramp rate, "RedFactor" is amount the variable ramp rate is reduced when the electric current is equal to the system current limit, "ZoneCurLim" is maximum electric current limit for the resistive heating element, "MeasuredCurrent" is the electric current that is measured, and "CurrentBand" is the electric current limit band.

In one variation, the heater includes a plurality of resistive heating elements that define a plurality of zones, where each of the plurality of zones has a defined variable ramp rate.

In another variation, the electric current at each of the plurality of zones is monitored, and the variable ramp rate is reduced from the desired ramp rate to the permitted ramp rate in response to at least one zone of the plurality of zones having an electric current that is greater than the lower limit of the electric current limit band.

In yet another variation, the method further includes determining a reduction amount for the at least one zone having the electric current greater than the lower limit of the electric current limit band based on a variable reduction factor, where the variable reduction factor increases as the electric current approaches the system current limit, and reducing the variable ramp rate for each of the plurality of zones based on the reduction amount to obtain the permitted ramp rate for each of the plurality of zones.

In one variation, the method further includes monitoring a zone temperature for each of the plurality of zones, determining whether a difference between a first zone temperature of a first zone from among the plurality of zones and a second zone temperature of a second zone from among the plurality of zones is greater than a deviation threshold, and adjusting the variable ramp rate for the first zone, the second zone, or in combination thereof in response to the difference being greater than the deviation threshold, where a zone from among the first zone and the second zone having a higher zone temperature is provided as a hot zone and the other among the first zone and the second zone is a cool zone.

In another variation, to adjust the variable ramp rate, the variable ramp rate for the hot zone is reduced, the variable ramp rate of the cool zone is increased, or a combination thereof.

In yet another variation, to adjust the variable ramp rate, the method further includes reducing the variable ramp rate of the hot zone to zero to hold the zone temperature of the hot zone until the difference is no longer greater than the deviation threshold, and increasing the variable ramp rate of the hot zone in response to the difference being less than the deviation threshold.

In one variation, the method further includes setting the variable ramp rate to a glide control rate, where the glide control rate is less than that of the desired ramp rate, and increasing the variable ramp rate to the desired ramp rate in response to a glide condition being satisfied, where the glide condition include a predetermined time passing, the temperature of the heater equaling a glide temperature setpoint that is less than the desired temperature setpoint, or a combination thereof.

In another variation, the method further includes determining whether the temperature of the heater is at a temperature approach threshold, where the temperature approach threshold is less than the desired temperature setpoint, and decreasing the variable ramp rate to an approach ramp rate in response to the temperature of the heater being at the temperature approach threshold, where the approach ramp rate is less than the desired ramp rate.

In one form, the present disclosure is directed to a control system for controlling power to a heater including a resistive heating element, and the control system includes a processor and a nontransitory computer-readable medium including instructions that are executable by the processor, where the instructions include determining amount of power to be provided to the resistive heating element of the heater based on a variable ramp rate to increase temperature of the heater to a desired temperature setpoint, where the variable ramp rate is set to a desired ramp rate. The instructions further include monitoring an electric current flowing through the resistive heating element of the heater and reducing the variable ramp rate from the desired ramp rate to a permitted ramp rate in response to the electric current being greater than a lower limit of an electric current limit band, where an upper limit of the electric current limit band is provided as a system current limit.

In one variation, the instructions further include determining a reduction amount of the desired ramp rate based on a variable reduction factor, where the variable reduction factor increases as the electric current of the resistive heating element approaches the system current limit, and decreasing the variable ramp rate by the reduction amount to obtain the permitted ramp rate.

In another variation, the variable reduction factor provides a scaled reduction of the variable ramp rate based on proximity of the electric current to the system current limit.

In yet another variation, the heater includes a plurality of resistive heating elements that define a plurality of zones, where each of the plurality of zones has a defined variable ramp rate.

In one variation, the electric current at each of the plurality of zones is monitored, and the variable ramp rate is reduced from the desired ramp rate to the permitted ramp rate in response to at least one zone of the plurality of zones having an electric current that is greater than the lower limit of the electric current limit band.

In another variation, the instructions further includes determining a reduction amount for the at least one zone having the electric current greater than the lower limit of the electric current limit band based on a variable reduction factor, where the variable reduction factor increases as the electric current approaches the system current limit, and reducing the variable ramp rate for each of the plurality of zones based on the reduction amount to obtain the permitted ramp rate for each of the plurality of zones.

In yet another variation, the instructions further include monitoring a zone temperature for each of the plurality of zones, determining whether a difference between a first zone temperature of a first zone from among the plurality of zones and a second zone temperature of a second zone from among the plurality of zones is greater than a deviation threshold, and adjusting the variable ramp rate for the first zone, the second zone, or in combination thereof in response to the difference being greater than the deviation threshold, where a zone from among the first zone and the second zone having a higher zone temperature is provided as a hot zone and the other among the first zone and the second zone is a cool zone.

In one variation, to adjust the variable ramp rate, the instructions further include reducing the variable ramp rate for the hot zone, increasing the variable ramp rate of the cool zone, or a combination thereof.

In another variation, the instructions further include reducing the variable ramp rate of the hot zone to zero to hold the zone temperature of the hot zone until the difference is no longer greater than the deviation threshold, and increasing the variable ramp rate in response to the difference being less than the deviation threshold.

In yet another variation, the instructions further include setting the variable ramp rate to a glide control rate, where the glide control rate is less than that of the desired ramp rate, and increasing the variable ramp rate to the desired ramp rate in response to a glide condition being satisfied, where the glide condition include a predetermined time passing, the temperature of the heater equaling a glide temperature setpoint that is less than the desired temperature setpoint, or a combination thereof.

In one variation, the instructions further include determining whether the temperature of the heater is at a temperature approach threshold, where the temperature approach threshold is less than the desired temperature setpoint, and decreasing the variable ramp rate to an approach ramp rate in response to the temperature of the heater being at the temperature approach threshold, where the approach ramp rate is less than the desired ramp rate.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 1:
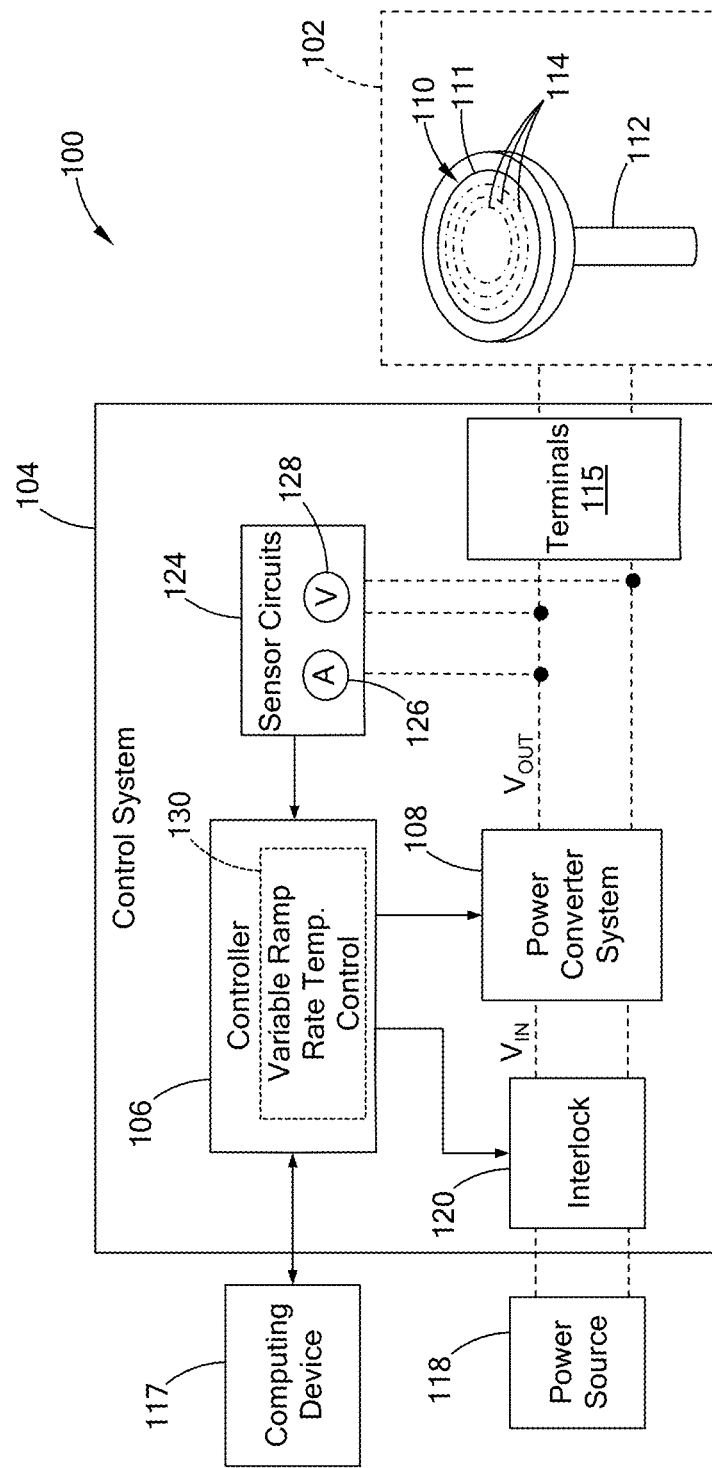
FIG. 1 illustrates a thermal system having a heater and control system with a variable ramp rate temperature control in accordance with the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

Referring to FIG. 1, a thermal system 100 includes a pedestal heater 102 and a control system 104 having a controller 106 and a power converter system 108. In one form, the heater 102 includes a heating plate 110 and a support shaft 112 disposed at a bottom surface of the heating plate 110. The heating plate 110 includes a substrate 111 and a plurality of resistive heating elements (not shown) embedded in or disposed along a surface of the substrate 111 (i.e., "plurality" means two or more). In one form, the substrate 111 may be made of ceramic or aluminum. The resistive heating elements are independently controlled by the control system 104 and define a plurality of heating zones 114 as illustrated by the dashed-dotted lines in FIG. 1. It is readily understood that the heating zones 114 could take a different configuration while remaining within the scope of the present disclosure. In addition, the pedestal heater 102 may include one or more zones and should not be limited to a multizone heater.

In one form, the heater 102 is a "two-wire" heater in which the resistive heating elements function as heaters and as temperature sensors with only two leads wires operatively connected to the heating element rather than four. Such two-wire capability is disclosed in, for example, U.S. Pat. No. 7,196,295, which is commonly assigned with the present application and incorporated herein by reference in its entirety. Typically, in a two-wire system, the resistive heating elements are defined by a material that exhibits a varying resistance with varying temperature such that an average temperature of the resistive heating element is determined based on a change in resistance of the resistive heating element. In one form, the resistance of the resistive heating element is calculated by first measuring the voltage across and the electric current through the heating elements and then, using Ohm's law, the resistance is determined. Using a resistance-temperature conversion data (e.g., a table, an algorithm, among others), a temperature of the resistive heating element and thus, the zone 114 is determined (i.e., a zone temperature). The resistive heating element may be defined by a relatively high temperature coefficient of resistance (TCR) material, a negative TCR material, or in other words, a material having a non-linear TCR.

The control system 104 controls the operation of the heater 102, and more particularly, is configured to independently control power to each of the zones 114. In one form, the control system 104 is electrically coupled to the zones 114 via terminals 115, such that each zone 114 is coupled to two terminals providing power and sensing temperature.

In one form, the control system 104 is communicably coupled (e.g., wireless and/or wired communication) to a computing device 117 having one or more user interfaces such as a display, a keyboard, a mouse, a speaker, a touch screen, among others. Using the computing device 117, a user may provide inputs or commands such as temperature setpoints, power setpoints, and/or commands to execute a test or a process stored by the control system 104.

The control system 104 is electrically coupled to a power source 118 that supplies an input voltage (e.g., 240V, 208V) to the power converter system 108 by way of an interlock 120. The interlock 120 controls power flowing between the power source 118 and the power converter system 108 and is operable by the controller 106 as a safety mechanism to shut-off power from the power source 118. While illustrated in FIG. 1, the control system 104 may not include the interlock 120.

The power converter system 108 is operable to adjust the input voltage and apply an output voltage ($V_{OUT}$) to the heater 102. In one form, the power converter system 108 includes a plurality of power converters (not shown) that are operable to apply an adjustable power to the resistive heating elements of a zone 114. One example of such a power converter system is described in U.S. Pat. No. 10,690,705 titled "POWER CONVERTER FOR A THERMAL SYSTEM", which is commonly owned with the present application and the contents of which are incorporated herein by reference in its entirety. In this example, each power converter includes a buck converter that is operable by the controller 106 to generate a desired output voltage that is less than or equal to the input voltage for one or more heating elements of a given zone 114. Accordingly, the power converter system 108 is operable to provide a customizable amount of power (i.e., a desired power) to each zone 114 of the heater 102. Other power converter systems configured to provide adjustable power to the heater 102 may also be used and should not be limited to the example provided herein. For example, the power converter system may be an isolated power converter system for providing an isolated power output to the heater. One example of such a power converter system is described in U.S. Pat. No. 11,038,431 titled "ISOLATED POWER CONVERTER FOR A THERMAL SYSTEM", which is commonly owned with the present application and the contents of which are incorporated herein by reference in its entirety.

With the use of a two-wire heater, the control system 104 includes sensor circuits 124 to measure electrical characteristics of the resistive heating elements (i.e., voltage and/or current), which is then used to determine performance characteristics of the zones 114, such as resistance, temperature, current, voltage, power, and other suitable information. In one form, a given sensor circuit 124 includes an ammeter 126 and a voltmeter 128 to measure an electric current flowing through and a voltage applied to the heating element(s) in a given zone 114, respectively. In another form, the voltage and/or current measurements may be taken at zero-crossing, as described in U.S. Pat. No. 7,196,295.

In lieu of or in addition to a "two-wire heater", the thermal system 100 may include discrete sensors for measuring characteristics of the heater 102 (e.g., voltage, current, and/or temperature) and provide respective data to the controller 106. For example, in one form, at least one voltmeter and ammeter may be provided to measure electrical characteristics (e.g., voltage and current) of the zone 114 and at least one temperature sensor may be provided to measure a temperature of the heater and/or temperature of each zone 114.

In one form, the controller 106 includes one or more microprocessors and memory for storing computer readable instructions executed by the microprocessors. In one form, the controller 106 is configured to perform one or more control processes in which the controller 106 determines the desired power to be applied to the zones 114, such as 100% of input voltage, 90% of input voltage, etc. Example control processes are described in U.S. Pat. No. 10,690,705 (referenced above), and U.S. Pat. No. 10,908,195 titled "SYSTEM AND METHOD FOR CONTROLLING POWER TO A HEATER, which is commonly owned with the present application and the contents of which are incorporated herein by reference in its entirety. In one form, the controller 106 performs a closed-loop temperature control in which the temperature of the heater is controlled to a temperature setpoint. For example, using the resistance of the resistive heating elements and a calibrated resistance-temperature model, the controller 106 determines a temperature of the zones 114 and then adjusts the power to the zones 114 to bring the temperature of the zones 114 closer to the temperature setpoint.

In one form, the control processes also includes a variable ramp rate temperature (VRRT) control 130 in which the heater 102 initially undergoes a variable temperature ramp rate to reach a temperature setpoint. Once at the temperature setpoint, the controller provides a steady-state closed loop control to maintain the temperature of the heater 102 at the temperature setpoint. In certain applications, the heater 102 may be controlled to different temperature setpoints for an industrial process and at times, temperatures may fluctuate and go from a first temperature to a second temperature that is much lower than the first temperature.

In one form, the VRRT control 130 is configured to provide a variable ramp-up control to increase the temperature of the heater 102 and a variable ramp-down control to reduce the temperature of the heater 102. While the VRRT control 130 is provided as having both, the VRRT control 130 can include one of the variable ramp-up control and the variable ramp-down control and is not required to have both.

The variable ramp-up control is configured to provide power to the resistive heating element of the heater 102 at a variable ramp-up rate to increase temperature of the heater 102 to the temperature setpoint. The variable ramp-up rate is defined based on the electric current provided to the heater 102 and for multizone heaters, temperature of the zones 114. More particularly, to inhibit damage to components of the thermal system 100 such as a power switches, power converters, wiring, and/or fuses, among others, the electric current applied to the heater 102 is controlled below a system current limit, which may be a zone current limit and/or heater current limit. For example, with the zones 114, the electric current to each zone 114 is monitored and controlled below a zone current limit, as the system current limit, for each zone 114. In one form, with respect to a multizone heater, the electric current at one zone may affect the electric current at the other zones. That is, to provide coherent ramping, when a single zone approaches the system current limit, the variable ramp-up control adjusts (e.g., decreases) the variable ramp-up rate for all the zones by the same rate of reduction. For a temperature setpoint, the variable ramp-up control defines a system current limit (i.e., maximum allowed current for the heater and/or the zones) and a desired ramp rate that is a maximum desired ramp rate for the variable ramp-up rate.

To provide a coherent temperature profile for a multizone heater, the variable ramp-up control monitors and controls the temperature of the zones 114 such that the temperature difference between any two zones 114 (e.g., a first zone and a second zone) is less than a deviation threshold (a zone-to-zone drift/deviation). More particularly, ramping is managed by a moving setpoint (i.e., a temperature ramping setpoint (TempRampSP)) that moves at a rate setpoint (RateSP, i.e., a variable ramp rate). That is, in one form, the rate setpoint is in ° C. per minute and is the rate at which the TempRampSP changes. The TempRampSP is an absolute temperature that the controller 106 holds a measured temperature to as it moves using, for example, proportional-integral-derivative (PID) control. The measured temperature may be referred to as a process value (PV). Since the TempRampSP is constantly moving until it reaches the temperature setpoint, the process value should also move. In one form, the integral time constant in the PID is responsive to build the power to match the rate setpoint. In one form, if the process variable of any one zone deviates from the process variables of the other zone(s) 114, the variable ramp-up control adjusts the RateSP of one or more zones to provide a coherent temperature control of the heater 102. In one form, the variable ramp-up control may decrease the RateSP of the zone deviating from other zones to provide coherent temperature profile. In another form, the variable ramp-up control may increase the RateSP of the other zone(s) to boost performance of those zones 114 while monitoring the electric current to the zones 114.

For the variable ramp-up control, table 1 provides control variables employed to control the ramp rate based on current and temperature:

| Variable | Definition | Abbreviation (unit) |
|---|---|---|
| Desired Ramp Rate | The rate the temperature should ramp at when it can and is typically fastest achievable rate. | Desired Rate (° C./min) |
| Variable Ramp Rate | Selected ramp rate. | RateSP (° C./min) |
| Zone Current Limit | Maximum allowable current for the zone. | ZoneCurLim (Amps) |
| Heater Current Limit | Maximum allowable current to the heater. | HeatCurLim (Amps) |
| Current Limit Band | Defines an electric current range close to the system current limit (e.g., zone current limit) and once within the range, the ramp rate is reduced. The range includes a lower limit and an upper limit. The upper limit can be set to the system current limit. The range is defined to be close to the system current limit but large enough to keep the ramp rate from passing the system current limit. | CurrentBand (Amps) |
| Reduction Factor | Amount the ramp rate is reduced by when the electric current is equal to system current limit. | RedFactor |
| Reduction Amount | The amount the ramp rate is reduced by. | RedAmt (° C./min) |
| Temperature Ramping Setpoint | Absolute temperature that the zone is controlled to as it moves to the temperature setpoint. | TempRampSP (° C.) |
| Temperature Setpoint | Setpoint that the zone is being ultimately controlled to. | TempSP (° C.) |

In one form, to control the ramp-rate based on current, the variable ramp-up control sets the variable ramp rate for a zone based on a measured current for the zone and the total current to the heater. In particular, the variable ramp rate is set to be just high enough to stay under the system current limit (e.g., the zone current limit and/or the zone current limit). The variable ramp rate is initially set to the desired ramp rate, and if the zone current limit is within the electric current limit band, the variable ramp rate is reduced from the desired ramp rate to a permitted ramp rate based on a calculated reduction amount. In addition to the zone approaching the zone current limit, the variable ramp rate of the other zones is reduced by the same reduction amount to provide coherent current control. The reduction amount is dependent on how close the measured current is to the system current limit such that the smaller the difference between the measured current and the system current limit the higher the reduction amount.

More particularly, the variable ramp-up control defines a scaled reduction amount for the electric current limit band that is based on a percentage of the reduction factor and a difference between the measured current and the system current limit such as the zone current limit. That is, an example application, the scaled reduction is based on the proximity of the electric current to the system current limit. For example, the reduction amount is determined using equations 1 and 2 in which the "% Reduction" is provided as a variable reduction factor that increases as the measured current of the resistive heating element for a zone approaches the zone current limit.

$$RedAmt = (DesiredRate * \% \ Reduction * RedFactor) \qquad \text{Equation 1}$$

$$\% \ Reduction = 1.0 - ((ZoneCurLim - MeasuredCurrent) / CurrentBand) \qquad \text{Equation 2}$$

As provided in equation 2, the variable reduction factor is configured to provide a scaled reduction such that the reduction parameter is 0% if the measured current is below the electric current limit band, between 0-100% if the measured current is within the electric current band, 100% if the measured current is equal to the system current limit, and greater than 100% if the measured current is greater the system current limit to provide even more reduction than the reduction factor. In one form, in the event the measured current is above the zone current limit, the variable ramp rate continues to decrease to a nominal rate such as 1° C./min or other suitable value to prevent stall-out.

In one form, to control the ramp-rate based on temperature, the variable ramp-up control measures the temperature of each zone and initially sets the temperature ramping setpoint of a zone to a respective measured temperature value to inhibit jumps in temperature. From this point, the temperature will begin to increase towards the temperature setpoint. The temperature of the zones is routinely measured and if the temperature of a zone begins to deviate from the other zones (i.e., too high or too low), the variable ramp-up rate is adjusted to provide coherent temperature. In one form, the variable ramp-up control reduces the ramp rate of the zone that is closest to the temperature setpoint (i.e., hot zone) to allow the other zones (i.e., cool zone(s)) to catch-up to the temperature ramping setpoint of the hot zone. The amount of reduction is selected to provide a responsive reduction, but is not too aggressive so as to reduce the heating operation. For example, the ramp rate may be decreased by 5-15% for every degree of deviation. In another form, while monitoring the electric current to the heater and zones, the variable ramp-up control increases the ramp rate of the cool zone(s) to allow the cool zone(s) to catch-up to the temperature ramping setpoint of the hot zone. For example, the ramp rate for the cool zone(s) may be increased in set incremental amounts (e.g., increase of 1° C./min, 2° C./min, 0.5° C./min). In this boost method, the variable ramp-up control may also reduce the ramp rate of the hot zone or hold the temperature of the hot zone to the present temperature ramping setpoint until the other zones are at or close to the measured temperature of the hot zone.

In one form, at the start of the control, the variable ramp-up control may provide a glide control to control how fast the ramp rate changes and an approach control when the temperature setpoint is being approached to reduce or inhibit a spike in temperature. More particularly, the ramp rate is set to a glide control rate, which is a significantly lower ramp-rate than the desired ramp rate (e.g., glide control rate=1.0° C./min). In one form, the ramp rate is maintained at the glide control rate until a glide condition is satisfied, where the glide condition can include, for example, a predetermined time and/or a desired temperature ramp setpoint (i.e., a glide temperature setpoint) is reached. After which, the variable ramp rate is increased to the desired ramp rate. In one form, the glide control rate is applied anytime the ramp rate changes to manage the acceleration of the ramp rate.

The approach control is configured to reduce the ramp rate to an approach ramp rate when the measured temperature is a defined distance/range (i.e., a temperature approach threshold) from the final temperature setpoint. The ramp rate is reduced to allow the heater to reach the temperature setpoint without overshooting the temperature setpoint. In one form, the approach control is applied when approaching the temperature setpoint (e.g., during ramp-up or ramp down) to give the integral time to wind to a value appropriate to the temperature setpoint. For example, if the factor is 1.0, the reduction starts at the rate number of degrees away from temperature setpoint. Accordingly, a reduction of 10° C./minute, begins to reduce 10° C. away from temperature setpoint.

The variable ramp-down control is configured to provide a coherent cool down of the heater to a temperature setpoint that is less than the measured temperature. For the semiconductor process, the rate at which the heater cools may be a function of the chamber and the rate can decrease as the temperature decreases and/or when walls of the chamber are heated. For a multizone heater, different zones of the heater may cool at different rates when power is removed or significantly reduced. To reduce the temperature difference between the zones, the variable ramp-down control is configured to keep the variable ramp rate at or above the natural fall rate (i.e., reduction rate with no power).

In one from, the variable ramp-down control decreases the temperature of the zones at a cooling variable ramp rate such that the temperature setpoint continuously decreases at a defined rate. For example, in one form, the cooling variable ramp rate is first set to a desired cooling ramp rate such as 10° C./min and the temperatures of the zones are monitored to maintain a coherent thermal profile of the heater during cool down.

To provide the coherent thermal profile, the variable ramp-down control determines whether one or more of the following runaway conditions is present: a zone-to-zone drift, a ramp setpoint deviation, and/or zone floating condition. If a runaway condition is detected, the variable ramp-down control performs a corrective action.

For the zone-to-zone drift, the variable ramp-down control determines whether a zone is cooling faster or slower than the other zones. Specifically, in one form, the variable ramp-down control determines whether a temperature of a subject zone is within a zone deviation threshold from the other zones. To reduce the deviation and provide a coherent ramp down, if the subject zone is deviating from one or more other zones, the variable ramp rate for all of the zones is adjusted, as the corrective action.

For the ramp setpoint deviation, the variable ramp-down control determines whether a zone lags too far from the temperature ramping setpoint while ramping down. Specifically, during ramp-down, the temperature ramping setpoint is continuously decreasing in accordance with the variable ramp rate. If the temperature of the subject zone is falling behind (i.e., not cooling fast enough), the ramp rate is adjusted such that the temperature of the subject zone continues to decrease while allowing the subject zone to catch up to the temperature ramping setpoint. In form, to detect a ramp setpoint deviation, the variable ramp-down control determines if the temperature of the subject zone deviates from the temperature ramping setpoint by a value greater than or equal to a setpoint deviation threshold (i.e., a deviation threshold). If so, a ramp setpoint deviating condition is detected.

To mitigate a zone-to-zone drift and/or a ramp setpoint deviation, the variable ramp-down control reduces the variable ramp rate to a value less than that of the desired ramp rate (e.g., from 10° C./min to 5° C./min), as the corrective action. In one form, the variable ramp-down control determines the amount of reduction (i.e., a ramp cooling reduction amount (RCoolRedAmt)) based on the amount of deviation between the temperature of the zone to the other zone and/or the temperature ramping setpoint. For example, in one form, the reduction amount is determined using equations 3-5 in which: PVH is measured temperature of the hot zone; PVL is measured temperature of the cool zone; WeightPara1 is a weighted parameter for the delta measured temperatures and is provided as the amount of reduction per degree of deviation (e.g., 10% PC); and WeightPara2 is a weighted parameter for the difference between the cool zone and the temperature ramp setpoint, and is provided as the amount of reduction per degree of deviation (e.g., 5%/° C.). Once determined, the ramp cooling reduction amount is applied to each zone of the zoner.

$$R\text{CoolRedAmt} = \text{Zone Deviation Reduction} + \text{Setpoint Deviation Reduction} \quad \text{Equation 3}$$

$$\text{Zone Deviation Reduction} = |(PVH-PVL)|*\text{WeightPara1} \quad \text{Equation 4}$$

$$\text{Setpoint Deviation Reduction} = |(PVL-\text{TempRampSP})|*\text{WeightPara2} \quad \text{Equation 5}$$

In one variation, the ramp cooling reduction amount is based on one of the zone deviation reduction or the setpoint deviation reduction (i.e., setpoint deviation amount). For example, if there is only a zone-to-zone drift, then the setpoint deviation reduction may not be necessary. Alternatively, if both deviation conditions are present, the variable ramp-down control may first reduce the deviation of the zone-to-zone drift based on the zone deviation reduction and until the deviation between the zones is within a threshold. After which, the ramp cooling reduction amount is determined using both the zone deviation reduction and setpoint deviation reduction as provided in equation 3. It should be readily understood that the numerical values provided herein are for explanation purposes only and can be any suitable value.

In another form, if the temperature of at least one zone begins to deviate from the other zones, the temperature ramping setpoint of the cool zone(s) is set to the measured temperature of the hot zone. That is, the variable ramp-down control increases power to the zone with the lower temperature to increase the temperature of the zone to that of the zone having the higher temperature Accordingly, the variable ramp-down control keeps the temperature of the zones together or within a deviation threshold (e.g., ±5° C.) which may flatten the temperature ramping setpoint curve before zones approach the temperature setpoint.

In the zone floating condition, the variable ramp-down control determines if a zone is floating or wandering. More particularly, as power decreases to the zone(s), it can be difficult to accurately measure the process value (e.g., temperature) and in some situations the power may be so low that the zone may be uncontrollable (e.g., power is at a minimum power level/output that is greater than zero volts, but is insufficient to control the zone). That is, the temperature of the zone may begin to deviate from the temperature ramping setpoint and if there are multiple zones, the temperature of the zone can begin to deviate from another zone. To control ramp-down during the zone floating condition, the variable ramp-down control is configured to increase power to the zone undergoing the floating condition to a nominal power output (e.g., 2% power, 5% power) that is greater than the minimum power level (i.e., minimum power output) to obtain control of the zone while still decreasing the temperature of the zone. In one form, power is increased by reducing the variable ramp set point until power is once again applied at the nominal power output. The nominal power output applied to the zone to inhibit the zone floating condition can be defined based on testing and may be just above the minimum power level (e.g., nominal power output is above 5V).

In the event more than one of the runaway conditions are detected, the reduction amount is a weighted combination of the reduction amount for the deviation conditions detected. In one form, the weight assigned for each deviation condition can be based on what stage the heater is at in the cool down process. That is, typically, ramp setpoint deviation occurs earlier of a cool down of the heater than the zone-to-zone drift, which may occur as the heater gets colder. Accordingly, the reduction amount associated with the ramp setpoint deviation is assigned a higher weight than the reduction amount associated with the zone-to-zone drift when the heater is first beginning to cool down. After some time and/or after the temperature of the heater reaches a selected temperature setpoint greater than the desired temperature setpoint, the variable ramp-down control may assign a higher weight to the reduction amount associated with the zone-to-zone drift than the ramping setpoint deviation. \At cooler temperatures, power to the heater may no longer be needed, so a minimal amount of power may be applied to inhibit zone floating condition, which may take precedent over the zone-to-zone drift and the ramp setpoint deviation. Accordingly, weighted factors can be assigned based on the stage of the heater during the cool down and on the heater itself (i.e., responsiveness of the heater).

It should be readily understood that the variable ramp-down control can be configured to monitor one or more runaway conditions, and is not required to monitor all. For example, for single zone heater, the zone-to-zone drift is not required.

Figure 2:
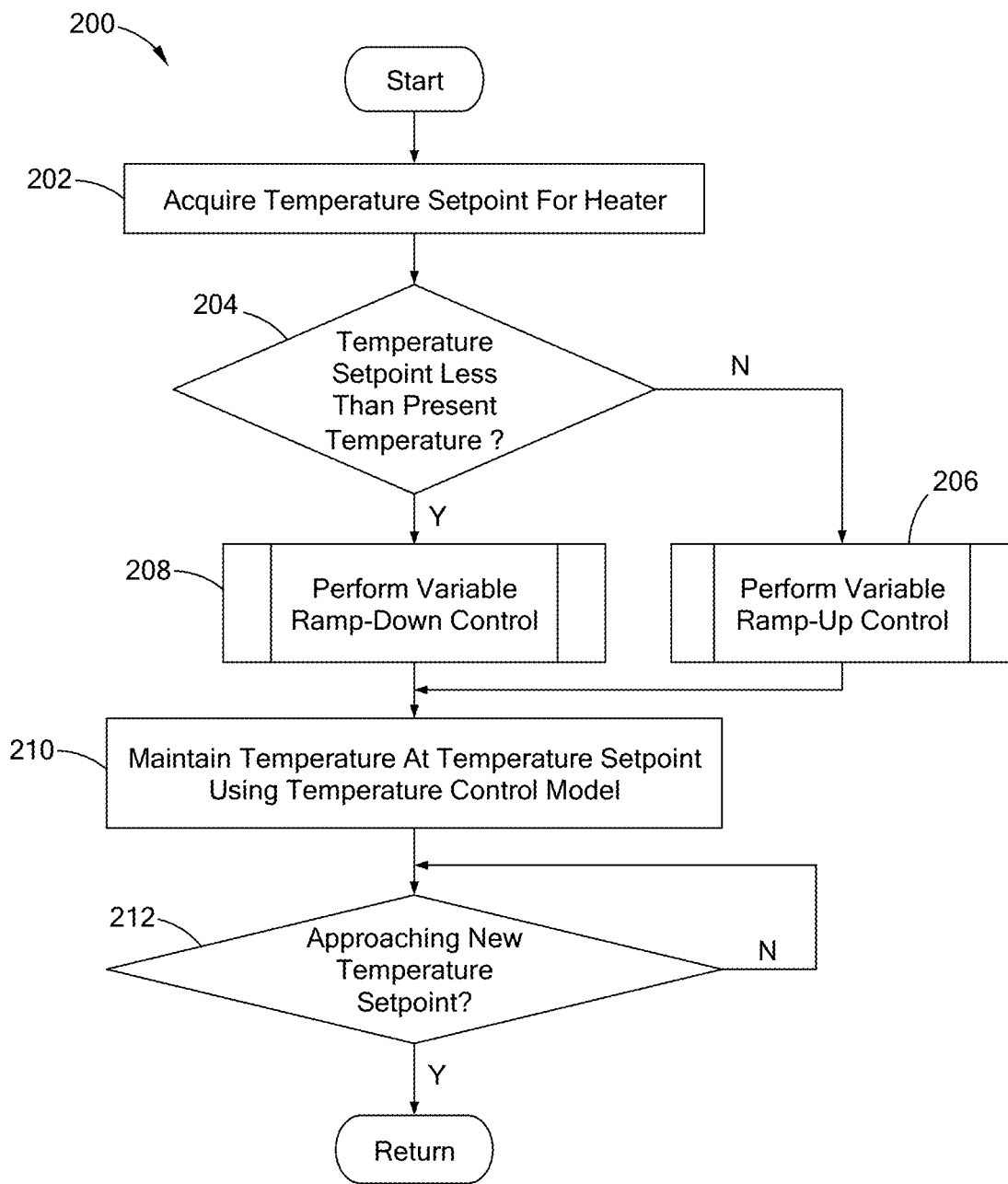
FIG. 2 is a flowchart of an exemplary variable ramp rate temperature control in accordance with the present disclosure.

Referring to FIG. 2, an example VRRT control routine 200 is provided and performed by the control system to control the temperature of the heater to one or more temperature setpoints. At 202, the control system acquires the temperature setpoint for the heater from, for example, a defined state mode that provides temperature setpoints and durations for the heater. At 204 determines if the temperature setpoint is less than the present temperature of the heater. If the temperature setpoint is higher, the control system performs the variable ramp-up control at 206. On the other hand, if the temperature is less, the control system performs the variable ramp-down control at 208. Once the temperature setpoint is reached, the control system returns to routine 200 to maintain the temperature at the temperature setpoint using a temperature control model (e.g., a PID control), at 210 and determines if there is a new temperature set-point, at 212. If there is a new temperature setpoint, the control system returns to 202. In one form, the temperature setpoint can include a nominal setpoint when then heater is turned off.

Figure 3:
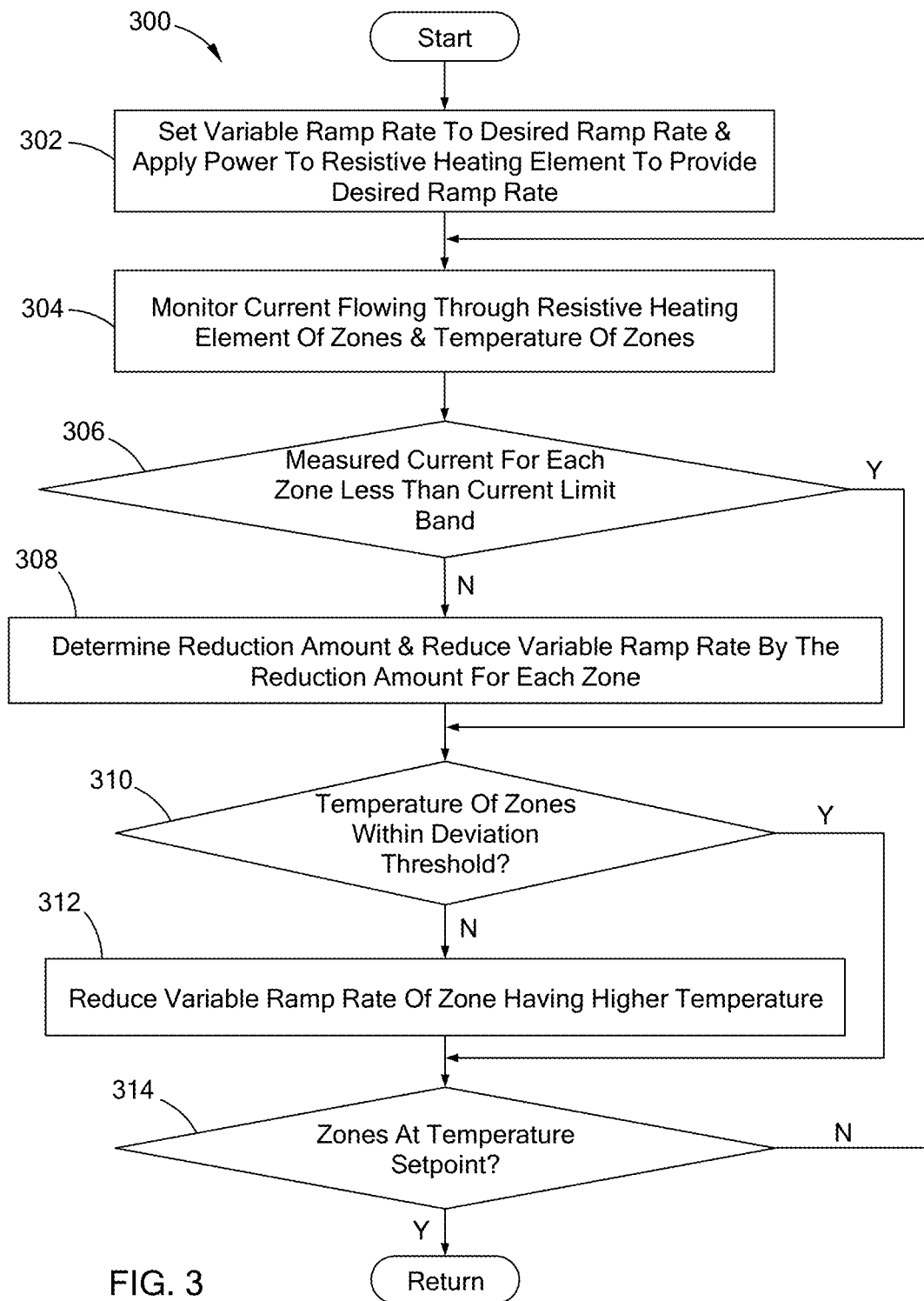
FIG. 3 is a flowchart of an example variable ramp-up control of FIG. 2.

Referring to FIG. 3, an example variable ramp-up control 300 is provided. At 302, the control system sets the variable ramp rate to a desired ramp rate that is defined based on the temperature setpoint and/or system current limit and provides power to the heater to achieve the desired ramp rate. At 304, the control system monitors the electric current flowing through the resistive heating elements of the zones and the temperature of each zone. At 306, the control system determines if the measured current for each zone is less than the electric current limit band. If so, the control system proceeds to 310. If not, the control system, at 308, determines the reduction factor and reduces the variable ramp rate for each zone based on the reduction factor. In particular, using the methodology described above, the control system determines the reduction factor that is correlated to how close the measured current is to the system current limit and reduces the variable ramp rate by the reduction amount to obtain a permitted ramp rate, as the variable ramp rate for each zone. At 310, the control system determines if the temperature of adjacent zones are within a deviation threshold to maintain a coherent temperature profile of the heater. If the temperatures are within the deviation threshold, the control system proceeds to 314. If at least one zone is deviating, the control system, at 312, reduces the variable ramp rate of the zone having the higher temperature, as provided above. Alternatively, the control system may be configured to boost power to the other zones while monitoring the electric current of the zones. At 314, the control system determines if the zones are at the temperature setpoint. If not, the control system returns to 304. If the zones are at the temperature setpoint, the control system returns to routine 200 of FIG. 2.

Figure 4:
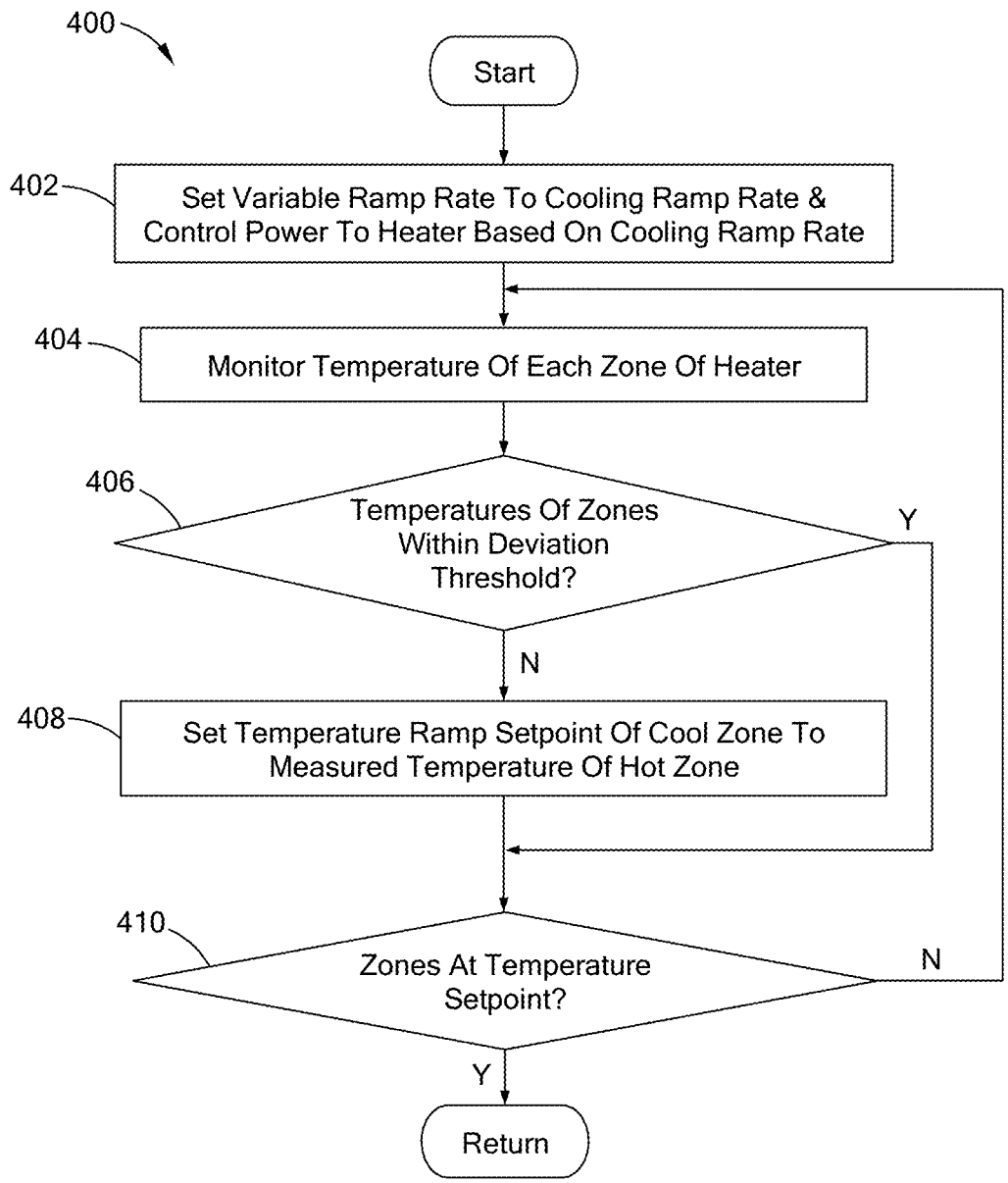
FIG. 4 is a flowchart of an example variable ramp-down control of FIG. 2.

Referring to FIG. 4, an example variable ramp-down control 400 is provided. At 402, the control system sets the variable ramp rate to a cooling ramp rate (e.g., a second variable ramp rate) and controls the zones based on the cooling ramp rate. At 404, the control system monitors the temperature of each zone and at 406, the control system determines if a temperature difference between the zones are within a deviation threshold to provide coherent temperature profile as the heater cools to the temperature setpoint. For example, the control system determines if the temperature difference between adjacent zones are greater than the deviation threshold. If the temperature differences are within the deviation threshold, the control system proceeds to 410. If at least one zone is deviating, the control system, at 408, sets the temperature ramp setpoint of the zone having lower temperature (i.e., cool zone) to measured temperature of the zone having higher temperature (hot zone) and thus, increases power to the cool zone to achieve the new temperature ramping setpoint. At 410, the control system determines if the zones are at the temperature setpoint. If not, the control system returns to 404. If the heater is at the temperature setpoint, the control system returns to routine 200 of FIG. 2.

It should be readily understood that the routines 200, 300, and 400 can be configured in various suitable ways and should not be limited to steps described herein. For example, if the heater is a single zone heater, the control system may skip steps related to providing coherent temperature profile in routine 300 and may omit the variable ramp-down routine. In another example, the VRRT control also includes a glide speed control and/or an approach control to provide smooth transition to the desired ramp rate and to the temperature setpoint, respectively. In yet another example, for the variable ramp-down control, in lieu of setting a cooling ramping rate, the control turns off power to heater and monitors the temperature of the zones to mitigate possible deviating temperature.

Figure 5A:
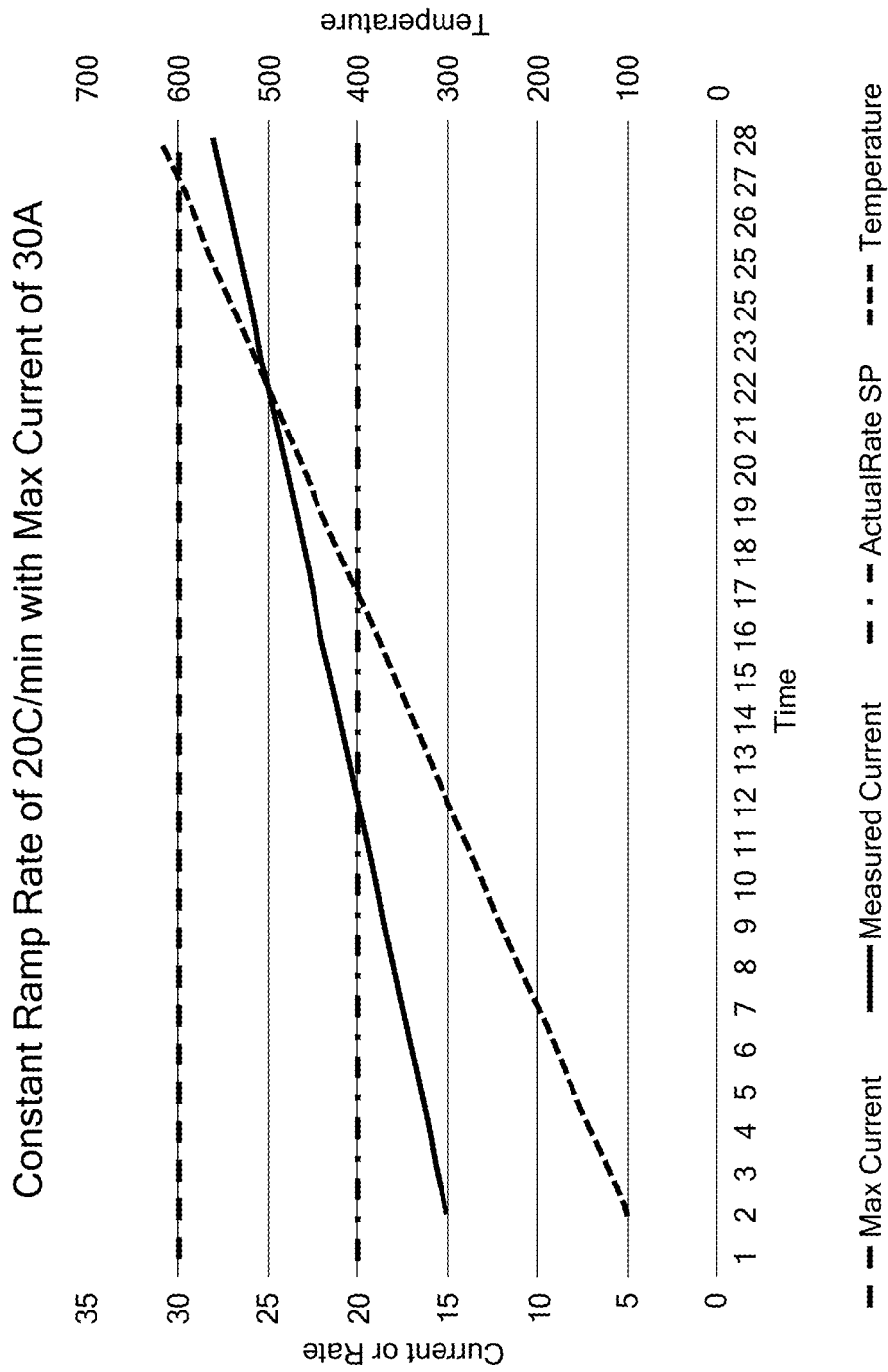
FIG. 5A is a graph a constant ramp-up control in accordance with the present disclosure.
Figure 5B:
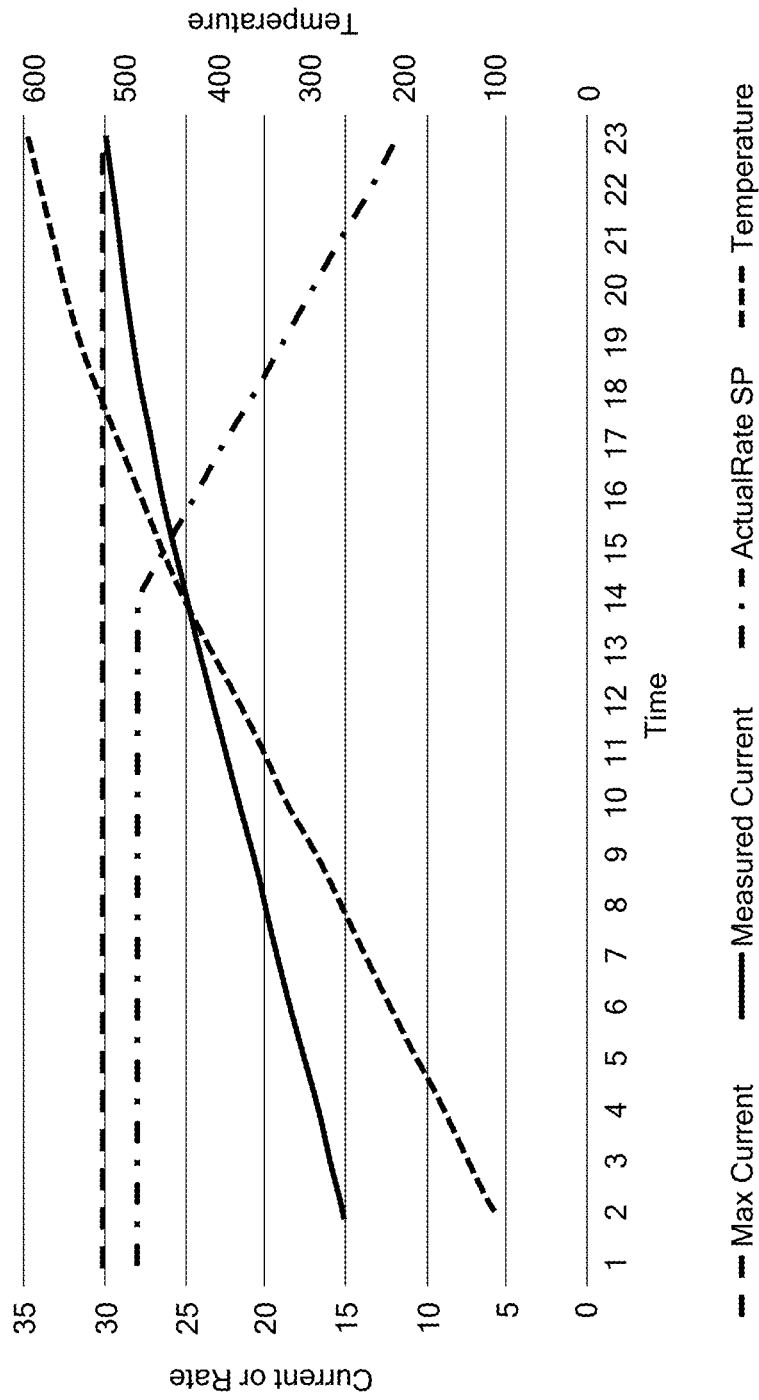
FIG. 5B is a graph of a variable ramp-up control in accordance with the present disclosure.

FIGS. 5A to 9 illustrate properties of the VRRT control of the present disclosure. Specifically, FIG. 5A illustrates a ramp-up operation in which the ramp-rate is constant (e.g., 20° C./min) and FIG. 5B illustrate a ramp-up operation using the VRRT control of the present disclosure. In both, the electric current is maintained under 30 A, but it takes longer for the constant ramp-up rate of FIG. 5A to reach 600° C. than the VRRT control of FIG. 5B. For the VRRT control, the ramp rate starts at 28° C./min and is reduced as the electric current approaches 30 A. That is, once the measured current is within an electric current limit band (e.g., 25-30 A), the ramp rate decreases to control the electric current applied to the heater while allowing the heater to reach temperature setpoint.

Figure 6:
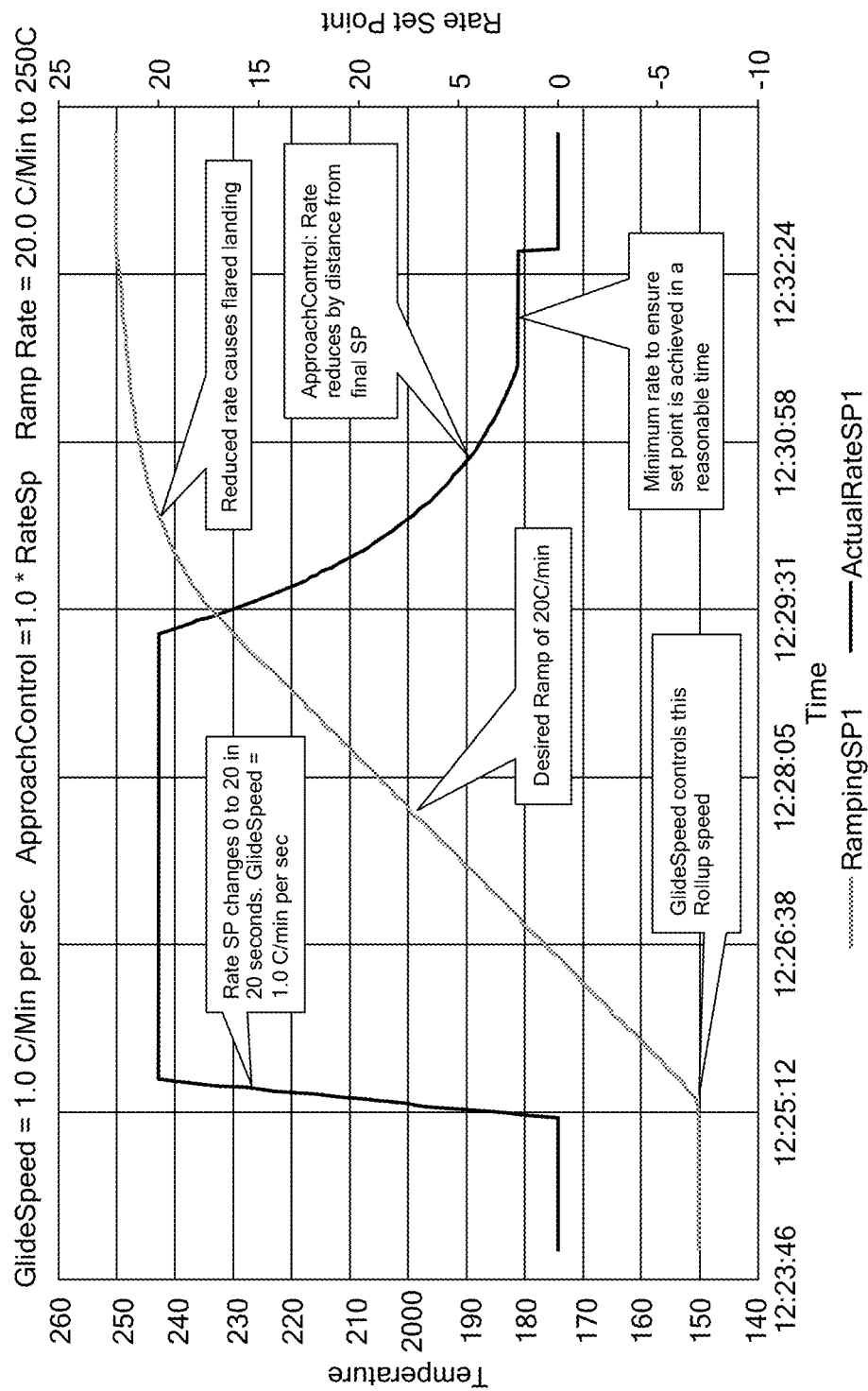
FIG. 6 is a graph of a variable ramp-up control in accordance with the present disclosure.

FIG. 6 is a graph that illustrates ramp-up control in which the ramp rate is controlled from a glide speed to the desired ramp rate, and then to an approach control rate when the measured temperature approaches the temperature setpoint.

Figure 7A:
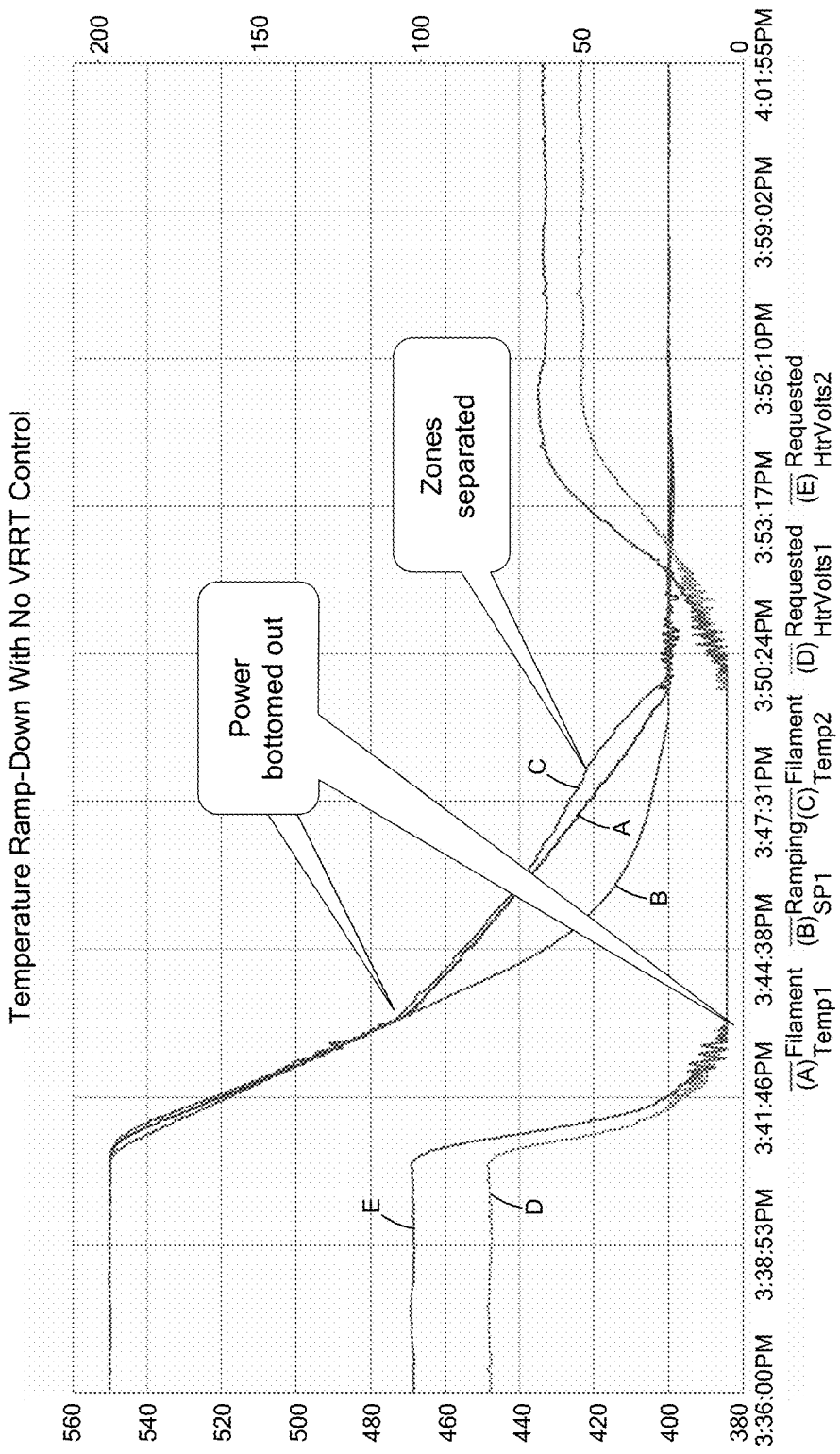
FIGS. 7A and 7B are graphs of variable ramp-down control in accordance with the present disclosure.
Figure 7B:
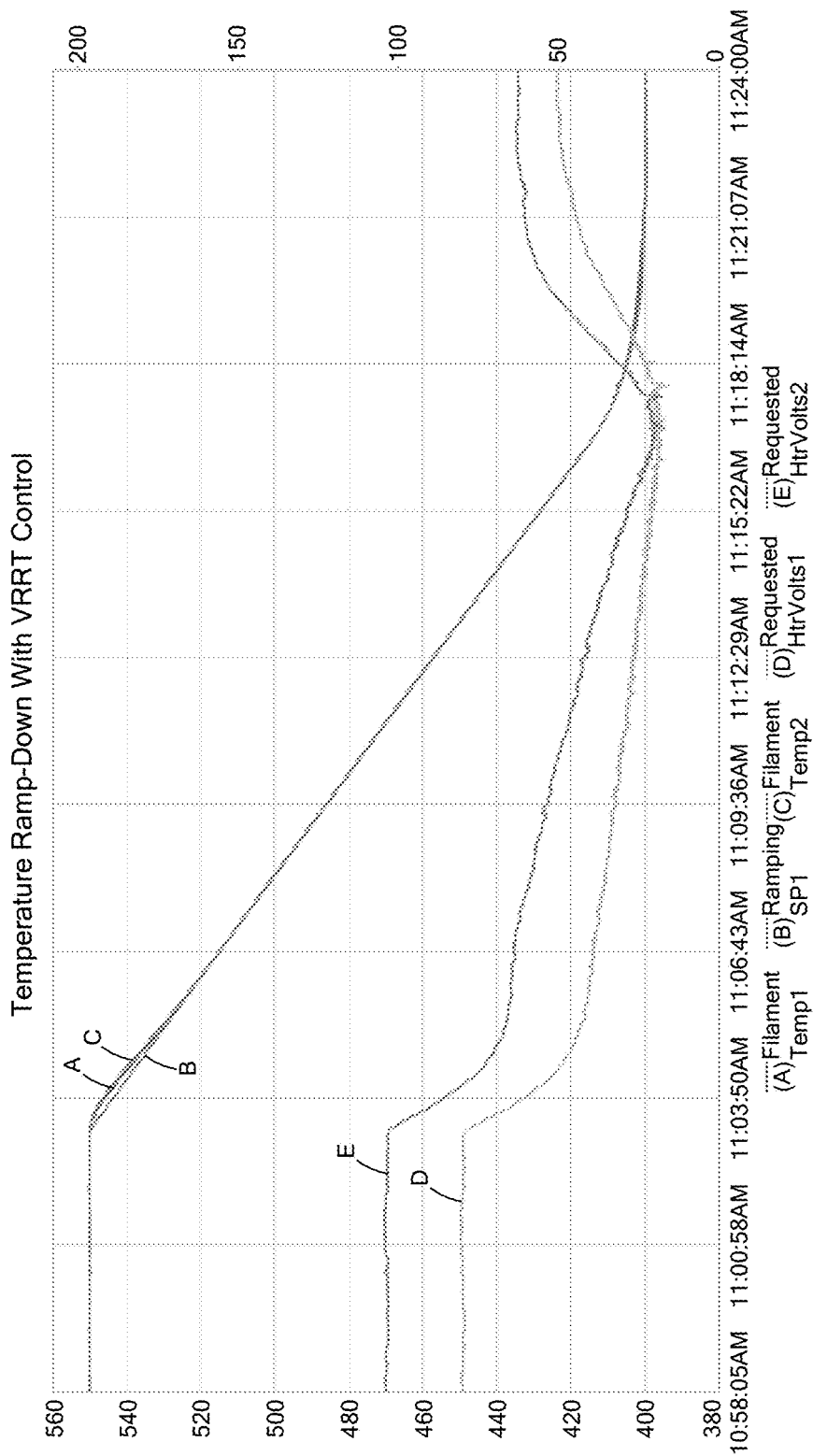

FIGS. 7A and 7B are graphs illustrating cooling of a two-zone heater without variable ramp-down control and with variable ramp-down control, respectively. As illustrated in FIG. 7A, the zone temperatures start to deviate from each other, which can cause thermal stress, whereas, in FIG. 7B, the heater has a coherent temperature profile by addressing the deviating temperatures.

Figure 8:
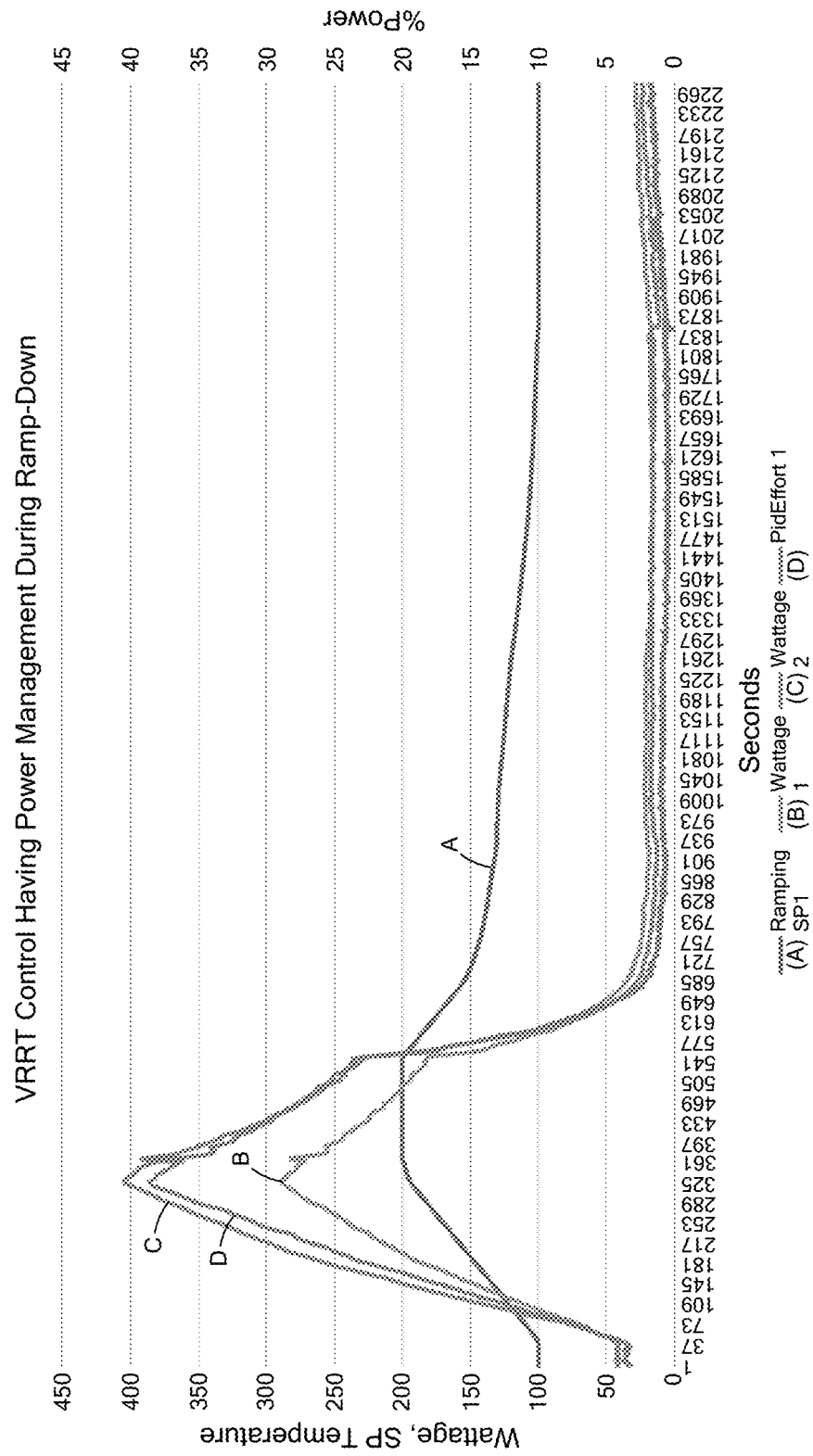
FIG. 8 is a graph of a variable ramp-down control to inhibit zone drift condition in accordance with the present disclosure.

FIG. 8 Illustrates the variable ramp-down control of the VRRT control in which the power is provided to the heater at a level slightly above the minimal amount (e.g., 5% power provided) to inhibit zone floating condition. By providing a small amount of power to the heater, the temperature of the heater is continuously monitored and still decreases to the temperature setpoint.

Figure 9:
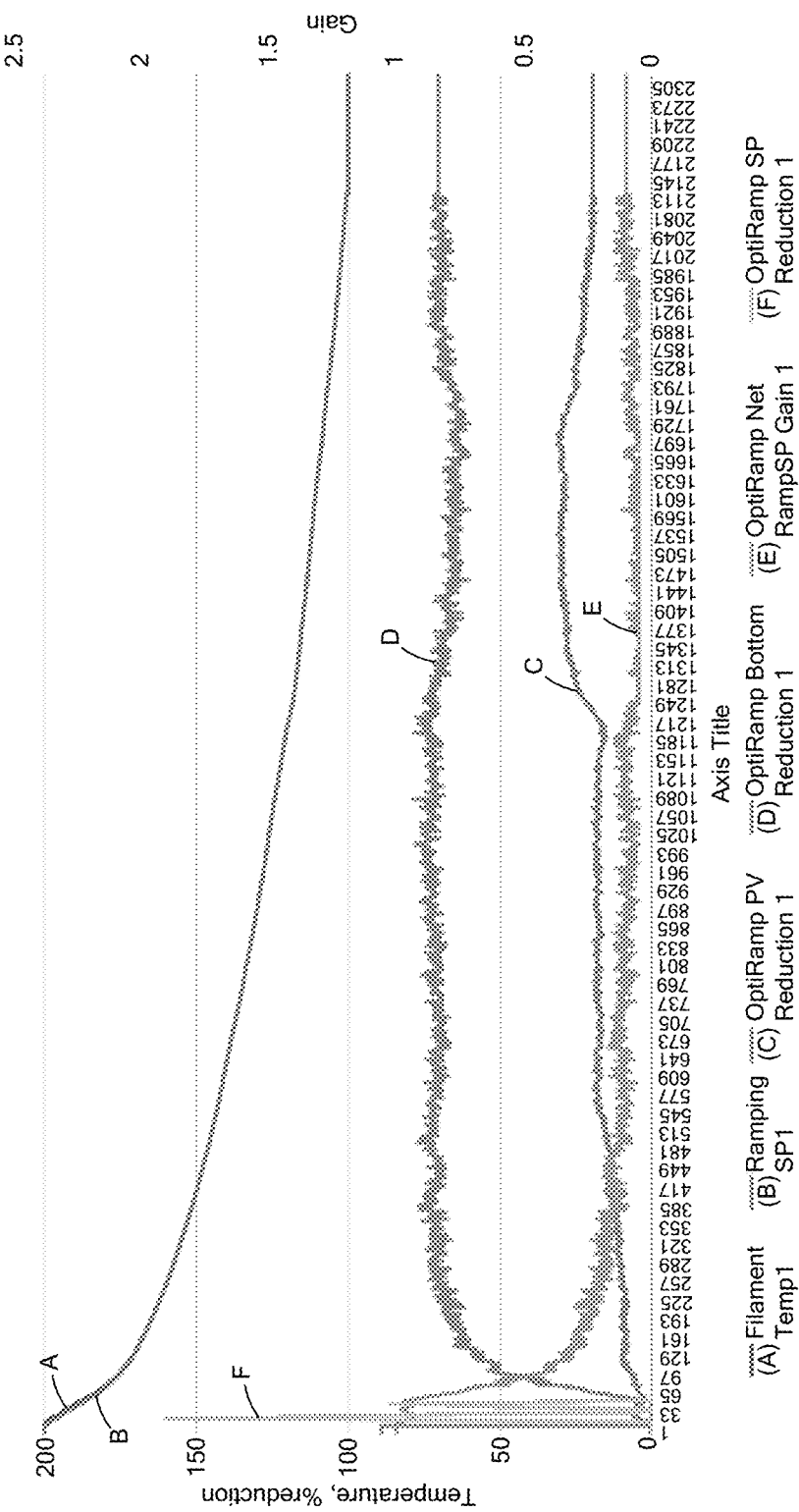
FIG. 9 is a graph of the variable ramp-down control to mitigate runaway conditions in accordance with the present disclosure.

FIG. 9 illustrates the variable ramp-down control in which the runaway conditions are reduced or inhibited by controlling ramp rate and/or power, as described above. In the figure, the filament temperature, which is representative of the heater temperature, and the temperature ramping setpoint (i.e., ramping setpoint (SP) in FIG. 9) are substantially the same during the ramp-down. In the figure, the optimal ramping process variation (PV) reduction is reduction amount due to different zones deviating too much; the optimal ramp bottom reduction is amount of reduction due to power getting too low (float); the optimal ramp net ramp setpoint (SP) gain is weighted summation of the three corrective actions (e.g., the net gain is between 0.0 to 1.0 multiplier on the desired ramping SP to reduce the ramp rate, where 1.0 no reduction and 0.5 is 50% reduction); and the optimal ramp setpoint (SP) reduction, which may spike initially because the zone(s) may deviate from the ramp SP.

As used herein, the term deviation threshold generally captures the various possible threshold defined for comparing the difference between a measured value (e.g., zone temperature, heater temperature) to another value (e.g., a temperature setpoint, a temperature of another zone, etc.). In one form, the deviation threshold employed for monitoring zone-to-zone drift/deviation in the variable ramp-up control and the variable ramp-down control may be the same or different threshold value. In one form, for the variable ramp-down control, the deviation threshold for the zone-to-zone drift and ramp setpoint deviation may be the same or may be different. In addition, the deviation threshold may be provided as a singular absolute value (e.g., 5° C.) or is provided as a range (e.g., ±5° C.). The actual value of the deviation threshold is based on the specific application and thus, is not limited to any specific numerical value provided herein.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, material, manufacturing, and assembly tolerances, and testing capability.

As used herein, the phrase at least one of A, B, and C should be construed to mean a logical (A OR B OR C), using a non-exclusive logical OR, and should not be construed to mean "at least one of A, at least one of B, and at least one of C."

In this application, the term "controller" may be replaced with the term "circuit". The term "controller" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The term code may include software, firmware, and/or microcode, and may refer to programs, routines, functions, classes, data structures, and/or objects. The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and nontransitory.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A method of controlling temperature of a heater including a resistive heating element, the method comprising:
applying power to the resistive heating element of the heater at a variable ramp rate to increase a temperature of the heater to a desired temperature setpoint, wherein the variable ramp rate is set to a desired ramp rate;
monitoring an electric current flowing through the resistive heating element of the heater; and
reducing the variable ramp rate from the desired ramp rate to a permitted ramp rate in response to the electric current being greater than a lower limit of an electric current limit band based on a variable reduction factor, wherein an upper limit of the electric current limit band is provided as a system current limit.

2. The method of claim 1, wherein reducing the variable ramp rate further comprises:
determining a reduction amount of the desired ramp rate based on the variable reduction factor, wherein the variable reduction factor increases as the electric current of the resistive heating element approaches the system current limit; and
decreasing the variable ramp rate by the reduction amount to the permitted ramp rate.

3. The method of claim 2, wherein the variable reduction factor provides a scaled reduction of the variable ramp rate based on proximity of the electric current to the system current limit.

4. The method of claim 2, wherein the reduction amount is determined based on the following RedAmt=(DesiredRate*% Reduction*RedFactor)

$$\% \text{ Reduction}=1.0-((\text{ZoneCurLim}-\text{MeasuredCurrent})/\text{CurrentBand}) \quad \text{Equation 2}$$

in which:
"RedAmt" is the reduction amount,
"DesiredRate is the desired ramp rate,
"RedFactor" is amount the variable ramp rate is reduced when the electric current is equal to the system current limit,
"ZoneCurLim" is maximum electric current limit for the resistive heating element,
"MeasuredCurrent" is the electric current that is measured, and
"CurrentBand" is the electric current limit band.

5. The method of claim 1, wherein the heater includes a plurality of resistive heating elements that define a plurality of zones, wherein each of the plurality of zones has a defined variable ramp rate.

6. The method of claim 5, wherein:
the electric current at each of the plurality of zones is monitored, and
the variable ramp rate is reduced from the desired ramp rate to the permitted ramp rate in response to at least one zone of the plurality of zones having an electric current that is greater than the lower limit of the electric current limit band.

7. The method of claim 6 further comprising:
determining a reduction amount for the at least one zone having the electric current greater than the lower limit of the electric current limit band based on the variable reduction factor, wherein the variable reduction factor increases as the electric current approaches the system current limit; and
reducing the variable ramp rate for each of the plurality of zones based on the reduction amount to obtain the permitted ramp rate for each of the plurality of zones.

8. The method of claim 5 further comprising:
monitoring a zone temperature for each of the plurality of zones;
determining whether a difference between a first zone temperature of a first zone from among the plurality of zones and a second zone temperature of a second zone from among the plurality of zones is greater than a deviation threshold; and
adjusting the variable ramp rate for the first zone, the second zone, or in combination thereof in response to the difference being greater than the deviation threshold, wherein a zone from among the first zone and the second zone having a higher zone temperature is provided as a hot zone and the other among the first zone and the second zone is a cool zone.

9. The method of claim 8, wherein to adjust the variable ramp rate, the method further comprises:
reducing the variable ramp rate for the hot zone;
increasing the variable ramp rate of the cool zone, or
a combination thereof.

10. The method of claim 8, wherein to adjust the variable ramp rate, the method further includes:

reducing the variable ramp rate of the hot zone to zero to hold the zone temperature of the hot zone until the difference is no longer greater than the deviation threshold; and increasing the variable ramp rate of the hot zone in response to the difference being less than the deviation threshold.

11. The method of claim 1 further comprising:

setting the variable ramp rate to a glide control rate, wherein the glide control rate is less than that of the desired ramp rate; and increasing the variable ramp rate to the desired ramp rate in response to a glide condition being satisfied, wherein the glide condition include a predetermined time passing, the temperature of the heater equaling a glide temperature setpoint that is less than the desired temperature setpoint, or a combination thereof.

12. The method of claim 1 further comprising:

determining whether the temperature of the heater is at a temperature approach threshold, wherein the temperature approach threshold is less than the desired temperature setpoint; and decreasing the variable ramp rate to an approach ramp rate in response to the temperature of the heater being at the temperature approach threshold, wherein the approach ramp rate is less than the desired ramp rate.

13. The method of claim 1 wherein the variable ramp rate is a variable rate at which a temperature changes with respect to time such that a magnitude of the variable rate varies.

14. The method of claim 1, further comprising moving a temperature ramping setpoint at the variable ramp rate until the temperature ramping setpoint reaches the desired temperature setpoint.

15. A control system for controlling power to a heater including a resistive heating element, the control system comprising:

a processor; and a nontransitory computer-readable medium including instructions that are executable by the processor, wherein the instructions include:

determining amount of power to be provided to the resistive heating element of the heater based on a variable ramp rate to increase a temperature of the heater to a desired temperature setpoint, wherein the variable ramp rate is set to a desired ramp rate;

monitoring an electric current flowing through the resistive heating element of the heater; and reducing the variable ramp rate from the desired ramp rate to a permitted ramp rate in response to the electric current being greater than a lower limit of an electric current limit band based on a variable reduction factor, wherein an upper limit of the electric current limit band is provided as a system current limit.

16. The control system of claim 15, wherein the instructions further include:

determining a reduction amount of the desired ramp rate based on the variable reduction factor, wherein the variable reduction factor increases as the electric current of the resistive heating element approaches the system current limit; and decreasing the variable ramp rate by the reduction amount to obtain the permitted ramp rate.

17. The control system of claim 16, wherein the variable reduction factor provides a scaled reduction of the variable ramp rate based on proximity of the electric current to the system current limit.

18. The control system of claim 15, wherein the heater includes a plurality of resistive heating elements that define a plurality of zones, wherein each of the plurality of zones has a defined variable ramp rate.

19. The control system of claim 18, wherein:

the electric current at each of the plurality of zones is monitored, and the variable ramp rate is reduced from the desired ramp rate to the permitted ramp rate in response to at least one zone of the plurality of zones having an electric current that is greater than the lower limit of the electric current limit band.

20. The control system of claim 19, wherein the instructions further includes:

determining a reduction amount for the at least one zone having the electric current greater than the lower limit of the electric current limit band based on the variable reduction factor, wherein the variable reduction factor increases as the electric current approaches the system current limit; and reducing the variable ramp rate for each of the plurality of zones based on the reduction amount to obtain the permitted ramp rate for each of the plurality of zones.

21. The control system of claim 19, wherein the instructions further include:

monitoring a zone temperature for each of the plurality of zones;

determining whether a difference between a first zone temperature of a first zone from among the plurality of zones and a second zone temperature of a second zone from among the plurality of zones is greater than a deviation threshold; and adjusting the variable ramp rate for the first zone, the second zone, or in combination thereof in response to the difference being greater than the deviation threshold, wherein a zone from among the first zone and the second zone having a higher zone temperature is provided as a hot zone and the other among the first zone and the second zone is a cool zone.

22. The control system of claim 21, wherein to adjust the variable ramp rate, the instructions further include:

reducing the variable ramp rate for the hot zone;

increasing the variable ramp rate of the cool zone; or a combination thereof.

23. The control system of claim 21, wherein the instructions further include:

reducing the variable ramp rate of the hot zone to zero to hold the zone temperature of the hot zone until the difference is no longer greater than the deviation threshold; and increasing the variable ramp rate in response to the difference being less than the deviation threshold.

24. The control system of claim 15, wherein the instructions further include:

setting the variable ramp rate to a glide control rate, wherein the glide control rate is less than that of the desired ramp rate; and increasing the variable ramp rate to the desired ramp rate in response to a glide condition being satisfied, wherein the glide condition include a predetermined time passing, the temperature of the heater equaling a glide temperature setpoint that is less than the desired temperature setpoint, or a combination thereof.

25. The control system of claim 15, wherein the instructions further include:
- determining whether the temperature of the heater is at a temperature approach threshold, wherein the temperature approach threshold is less than the desired temperature setpoint; and
- decreasing the variable ramp rate to an approach ramp rate in response to the temperature of the heater being at the temperature approach threshold, wherein the approach ramp rate is less than the desired ramp rate.

* * * * *